United States Patent [19]
Shaik et al.

[11] Patent Number: 5,623,234
[45] Date of Patent: Apr. 22, 1997

[54] CLOCK SYSTEM

[75] Inventors: Yehuda Shaik, Ramat Gan; Moti Kurnick, Tel Aviv; Alick Einav, Nathanya; Stefania Gandal, Herzlia Bet, all of Israel

[73] Assignee: Motorola, Schaumburg, Ill.

[21] Appl. No.: 610,503

[22] Filed: Mar. 4, 1996

[51] Int. Cl.$^6$ ...................................................... G06F 1/08
[52] U.S. Cl. ......................... 331/49; 327/292; 364/934.4
[58] Field of Search ........................ 331/49, 46; 307/64, 307/85, 86, 87; 327/292

[56] References Cited

U.S. PATENT DOCUMENTS 5,155,840 10/1992 Niijima ..................................... 395/550
5,196,810  3/1993 Graether et al. ........................... 331/49

Primary Examiner—Robert Pascal
Assistant Examiner—An T. Luu
Attorney, Agent, or Firm—Keith E. Witek

[57] ABSTRACT

A clock system (2) for providing a system clock signal at a clock output (4) for use by a processing unit comprises a first oscillator circuit (6) which is enabled in response to a wake up signal provided by the processing unit to provide a first clock signal (RINGO CLOCK) at an output, and a second oscillator circuit (8) comprising a PLL (14) and an oscillator (16). The second oscillator (8) circuit provides a second clock signal (PLL CLOCK) and a lock signal (LOCKED) at first and second outputs respectively when the PLL is locked. The clock system (2) further comprises control circuitry (10) coupled to the output of the first oscillator circuit (6) and to the first and second outputs of the second oscillator circuit (8) for coupling the first clock signal (RINGO CLOCK) to the clock output (4) to provide the system clock signal or when the control circuitry (10) receives the lock signal (LOCKED) for coupling the second clock signal (PLL CLOCK) and not the first clock signal (RINGO CLOCK) to the clock output (4) to provide the system clock signal.

7 Claims, 3 Drawing Sheets

BLOCK DIAGRAM

CLOCK SYSTEM

FIELD OF THE INVENTION

This invention relates to clock systems for providing a system clock signal when enabled for use by a processing unit. The clock system is enabled in response to a wake up signal provided by the processing unit.

BACKGROUND OF THE INVENTION

Low power semiconductor circuit designs have become increasingly useful in the last few years as more wireless battery operated products, and similar products, have been developed which require short bursts of very fast operation, separated by long 'sleep' periods during which the semiconductor circuits are expected to draw minimal power. An additional significant requirement for such applications is a very fast wake up time for the system when an external event wakes up the system.

In order to meet these requirements, special circuitry must be implemented in the circuit.

In order to achieve the very low power consumption requirement during the 'sleep' periods or low power mode, low power circuits are normally clocked with an external low frequency 32 KHz crystal and an internal oscillator and Phase Lock Loop (PLL) provide an accurate system clock with a high frequency. In the low power mode, the PLL is disabled internally or both the PLL and the oscillator are disabled internally.

When the PLL alone is disabled, the power consumption is in the order of milli-watts and the wake up time is in the order of milli-seconds (about 15.6 msecs using a 32 KHz crystal). When both the PLL and the oscillator are disabled, power consumption is in the order of micro-watts but the wake up time of the oscillator is measured in seconds (about 2.2 seconds using a 2 KHz crystal).

There is therefore a need for an improved clock system for generating a system clock signal that has both a low power consumption in the low power mode and a fast wake up time.

SUMMARY OF THE INVENTION

In accordance with the present invention there is provided a clock system for providing a system clock signal at a clock output, when enabled, for use by a processing unit, the clock system being enabled in response to a wake up signal provided by the processing unit. The clock system comprises a first oscillator circuit which is enabled in response to the wake up signal to provide a first clock signal at an output, and a second oscillator circuit comprising a PLL and an oscillator. The second oscillator circuit, when enabled, provides a second clock signal and a lock signal at first and second outputs respectively when the PLL is locked. The clock system further comprises control circuitry coupled to the output of the first oscillator circuit and to the first and second outputs of the second oscillator circuit for coupling the first clock signal to the clock output to provide the system clock signal or for coupling the second clock signal and not the first clock signal to the clock output to provide the system clock signal when the control circuitry receives the lock signal.

Thus, the present invention provides a clock system that has a very quick wake up time due to the first oscillator circuit that allows the processing unit to immediately process the wake-up event, whilst the PLL and oscillator are being enabled, if at all, and minimum power consumption during the low power mode since the PLL and oscillator can both be disabled during the low power mode.

Preferably, the first oscillator circuit comprises a ring oscillator circuit.

In a preferred arrangement the second oscillator circuit is enabled in response to a signal generated by the processing unit after the wake-up signal, and wherein the second oscillator circuit provides the lock signal a predetermined time after the second oscillator circuit is enabled.

This means that in the preferred arrangement the PLL and oscillator are only enabled when they are required which allows additional power savings by not requiring the PLL and oscillator to be enabled when it is not necessary.

BRIEF DESCRIPTION OF THE DRAWINGS

The present invention will now be described, by way of example only, with reference to the accompanying diagrams in which.

DETAILED DESCRIPTION OF THE DRAWINGS

Figure 1:
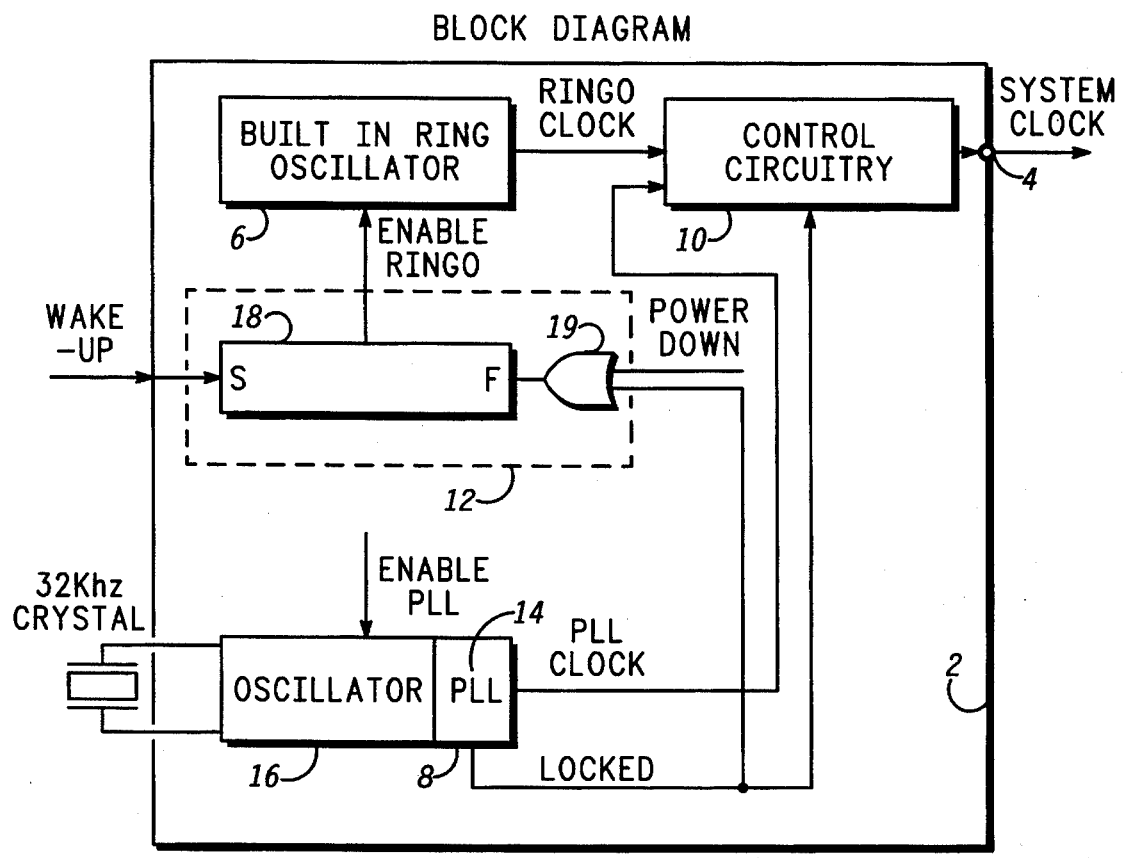
FIG. 1 is a block schematic diagram of a clock system in accordance with the present invention.

Referring firstly to FIG. 1, a clock system 2 in accordance with a preferred embodiment of the present invention for providing a system clock signal at a clock output 4 for clocking a processing unit (not shown) comprises first oscillator circuit 6, second oscillator circuit 8, and control circuitry 10 coupled to the first oscillator circuit 6 and second oscillator circuit 8. An output of the control circuitry 10 is coupled to the clock output 4. The processing unit may be, for example, a CPU.

The second oscillator circuit 8 comprises a Phase Lock Loop (PLL) 14 and an oscillator 16. The oscillator 16 is coupled to an external crystal which for low power applications is preferably a 32 KHz crystal. The second oscillator circuit 8 is enabled in response to a PLL enable signal (ENABLE PLL) set to a logic '1' and when enabled provides a second clock signal (PLL CLOCK) at a first output and a lock signal (LOCKED) set to a logic '1' at a second output when the PLL is locked. The lock signal and second clock signal are provided to the control circuitry 10. The second oscillator circuit 8 is disabled when the PLL enable signal (ENABLE PLL) is negated to a logic '0'. The lock signal (LOCKED) is negated when the PLL is not locked or when the second oscillator circuit 8 is disabled.

In different embodiments of the present invention, the second oscillator circuit 8 is enabled in response to a wake up signal (WAKE UP) generated by the processing unit, or in response to a specific signal from the processing unit or never. The operation of the clock system in accordance with the different embodiments is described below with reference to FIGS. 3–5 which concern three different sequence of events.

The first oscillator circuit 6 is enabled in response to the wake up signal (WAKE UP) generated by the processing unit and when enabled, provides a first clock signal (RINGO CLOCK) at an output which is coupled to the control circuitry 10. Enable logic 12 is coupled to receive the wake up signal (WAKE UP) and in response thereto provides an enable signal (ENABLE RINGO) set to a logic '1' to enable the first oscillator circuit 6. The lock signal (LOCKED) and a power down signal (POWER DOWN) generated by the processing unit (not shown) are also coupled to the enable logic 12. The enable logic 12 preferably comprises a flip-flop 18 having a set input coupled to receive the wake up signal (WAKE UP) and a reset input, and an OR gate 19 having a first input coupled to receive the lock signal (LOCKED), a second input coupled to receive the power down signal (POWER DOWN) and an output coupled to the reset input of the flip-flop 18. The first oscillator circuit 6 is disabled in response to the enable signal (ENABLE RINGO) being negated to a logic '0'.

Figure 2:
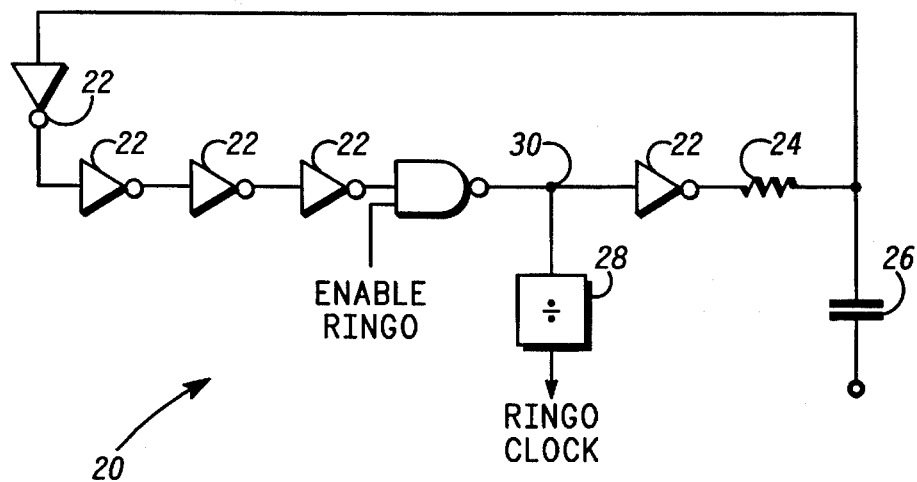
FIG. 2 is a schematic circuit diagram of a ring oscillator circuit for use in the clock system of FIG. 1.

The first oscillator circuit 6 comprises an oscillator with a very quick wake up time. In a preferred embodiment, the first oscillator circuit comprises a ring oscillator circuit such as the circuit 20 shown in FIG. 2. The ring oscillator circuit 20 comprises an odd number of inverters 22 connected in a ring in series with a resistor 24 and capacitor 26, and a divider 28 coupled to an output node 30 in the ring. The divider 28 divides the signal at the output node 30 by a multiple of two, and the signal at an output of the divider forms the first clock signal (RINGO CLOCK). The signal at output node 30 is divided by 2 in order to ensure a 50% duty cycle. The ring oscillator circuit 20 is enabled in response to the enable signal (ENABLE RINGO) being set to a logic '1' and disabled when the enable signal (ENABLE RINGO) is negated. The ring oscillator circuit 20 starts its oscillations as soon as the enable signal (ENABLE RINGO) is set. The wake up time of such a ring oscillator circuit is therefore very quick.

The first clock signal generated by the ring oscillator circuit 20 has a frequency variation of 1:4, e.g. from 1 MHz to 4 MHz. The frequency variation depends on the process and operating conditions (voltage and temperature). The accuracy of the clock frequency of the first clock signal generated by the oscillator circuit 20 is sufficient to initiate processing of wake up events but is not be sufficient for some of the processing operations of the processing unit.

In a preferred embodiment, the control circuitry 10 is a multiplexer having a first input coupled to the output of the first oscillator circuit 6 for receiving the first clock signal (RINGO CLOCK), a second input coupled to the first output of the second oscillator circuit 8 for receiving the second clock signal (PLL CLOCK) and a control input coupled to the second output of the second oscillator circuit 8 for receiving the lock signal (LOCKED). Either the first clock signal or the second clock signal are selected to be coupled to the output of the multiplexer in dependence on the logic state of the lock signal (LOCKED). When the PLL 14 is locked, the lock signal (LOCKED) is set and the multiplexer couples the second clock signal to the clock output 4.

Figure 3:
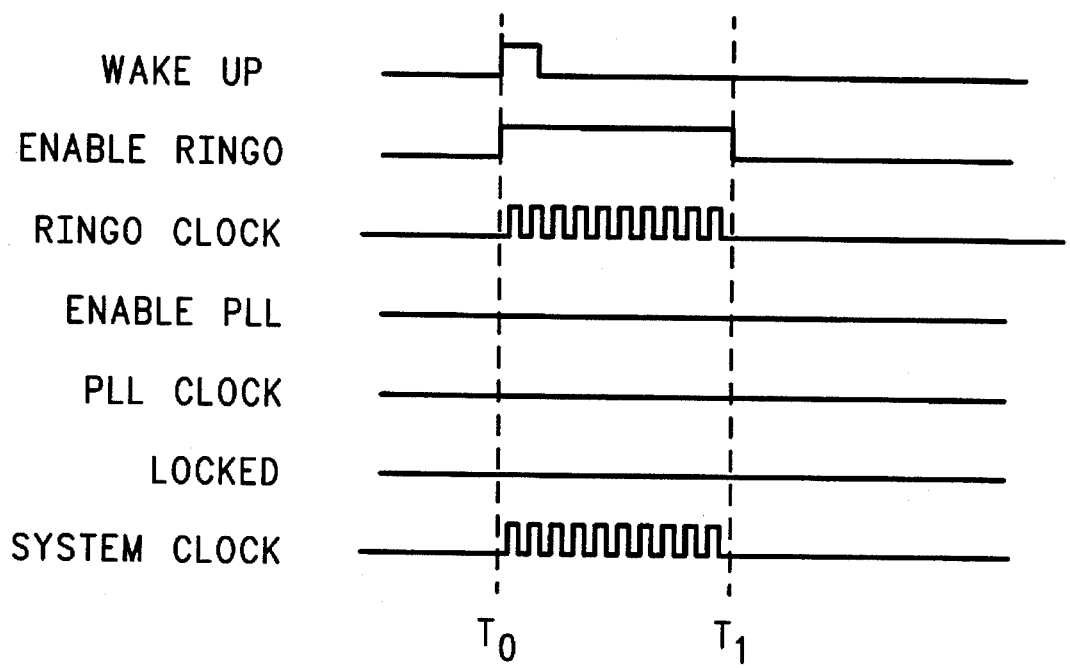
FIG. 3 shows representations of some of the signals generated in the clock system of FIG. 1 for a first sequence of events.
Figure 4:
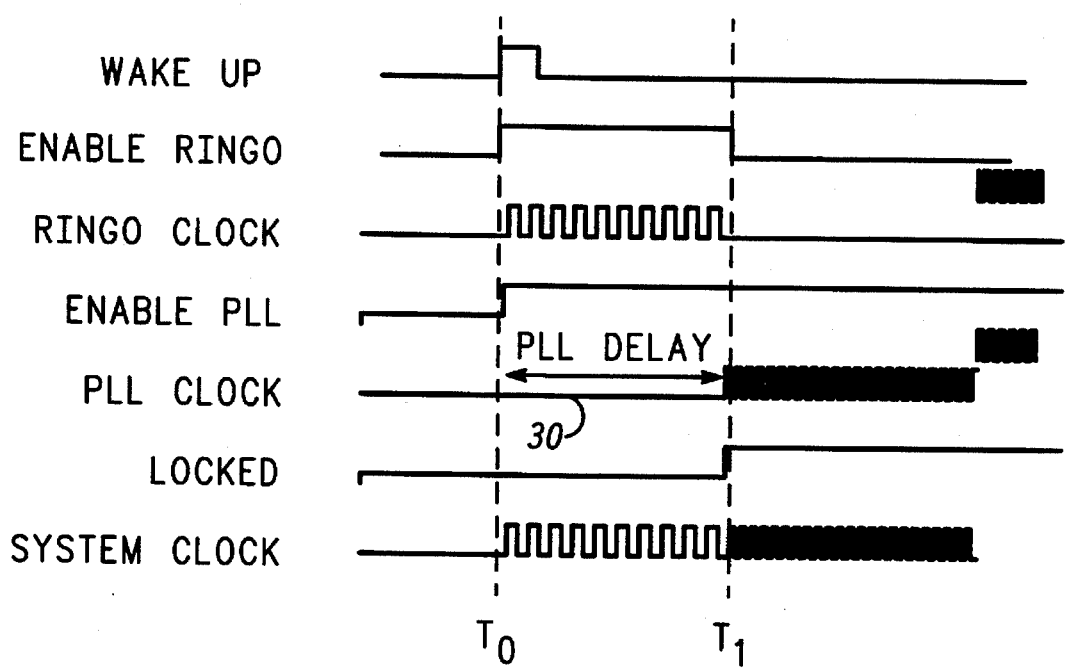
FIG. 4 shows representations of some of the signals generated in the clock system of FIG. 1 for a second sequence of events.
Figure 5:
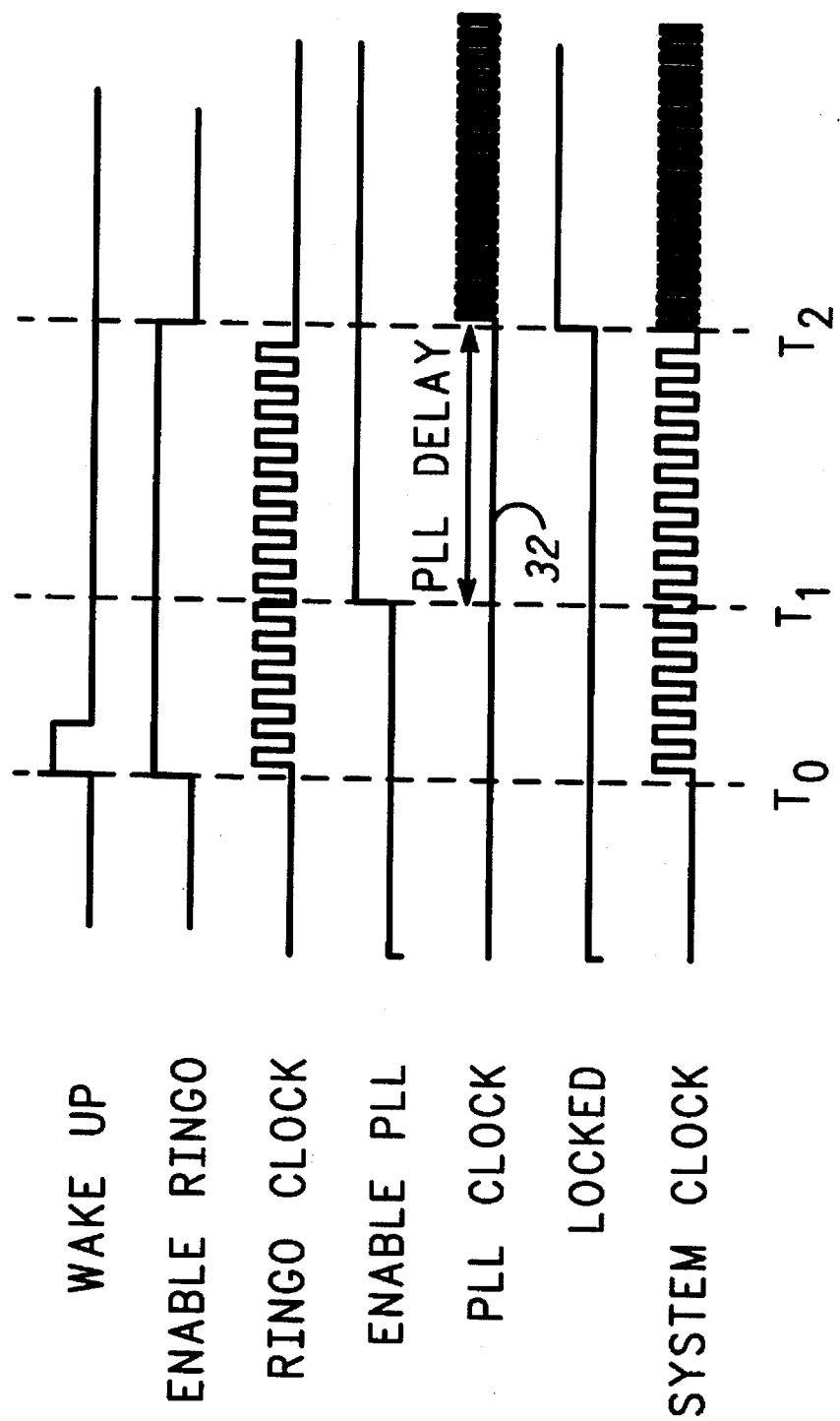
FIG. 5 shows representations of some of the signals generated in the clock system of FIG. 1 for a third sequence of events.

The operation of the clock system 2 in accordance with the present invention will now be described for three different sequence of events with reference to FIGS. 1–5. FIGS. 3–5 show representations of some of the signals generated in the clock system 2 for the different sequences of events.

For the first sequence shown in FIG. 3, at time T0 a wake-up event occurs and the processing unit generates a wake up signal (WAKE UP) which is provided to the enable logic 12. In response to receiving the wake up signal (WAKE UP), the enable logic 12 sets the enable signal (ENABLE RINGO) which enables the ring oscillator circuit 20. Once enabled, the ring oscillator circuit 6,20 starts to oscillate and provides the first clock signal (RINGO CLOCK) to the control circuitry 10. Since the second oscillator circuit 8 is disabled and hence the lock signal (LOCKED) is negated, the control circuitry 10 selects the first clock signal (RINGO CLOCK) such that the first clock signal (RINGO CLOCK) provides the system clock signal at the clock output 4.

The processing unit (not shown) then generates an interrupt and reads event registers (not shown) to determine what actions it needs to take. In the first sequence shown in FIG. 3, the processing unit, having read the event registers, decides that no processing is required and enters a low power mode at time T1 by generating the power down signal (POWER DOWN) which is coupled to the enable logic 12. In response to receiving the power down signal (POWER DOWN), the enable logic 12 negates the enable signal (ENABLE RINGO) which disables the ring oscillator circuit 20 such that the clock system 2 is disabled and no system clock signal is generated.

The first sequence of events occurs in clock systems where a periodic interrupt timer wakes up the clock system on a regular basis for status checks.

For the second sequence shown in FIG. 4, at time T0 a wake-up event occurs and the processing unit generates a wake up signal (WAKE UP) which is provided to the enable logic 12. In response to receiving the wake up signal (WAKE UP), the enable logic 12 sets the enable signal (ENABLE RINGO) which enables the ring oscillator circuit 20. Once enabled, the ring oscillator circuit 6,20 starts to oscillate and provides the first clock signal (RINGO CLOCK) to the control circuitry 10.

At T0, the PLL enable signal (ENABLE PLL) is also set in response to the wake up signal (WAKE UP) and hence the second oscillator circuit 8 is also enabled at time T0. The PLL is however not locked immediately but is locked a predetermined time 30 (T1–T0) after the second oscillator circuit 8 is enabled.

Since the lock signal (LOCKED) is initially negated, the control circuitry 10 initially selects the first clock signal (RINGO CLOCK) such that the first clock signal (RINGO CLOCK) provides the system clock signal at the clock output 4. Once the lock signal (LOCKED) has been set at time T1, the control circuitry 10 selects the second clock signal (PLL CLOCK) such that the second clock signal (PLL CLOCK) provides the system clock signal at the clock output 4. The enable logic 12, in response to receiving a set lock signal (LOCKED), negates the enable signal (ENABLE RINGO) and the ring oscillator circuit 20 is disabled.

For the third sequence shown in FIG. 5, at time T0 a wake-up event occurs and the processing unit generates a wake up signal (WAKE UP) which is provided to the enable logic 12. In response to receiving the wake up signal (WAKE UP), the enable logic 12 sets the enable signal (ENABLE RINGO) which enables the ring oscillator circuit 20. Once enabled, the ring oscillator circuit 6,20 starts to oscillate and provides the first clock signal (RINGO CLOCK) to the control circuitry 10. Since the lock signal (LOCKED) is initially negated, the control circuitry 10 initially selects the first clock signal (RINGO CLOCK) such that the first clock signal (RINGO CLOCK) provides the system clock signal at the clock output 4.

The processing unit (not shown) then generates an interrupt and reads event registers (not shown) to determine what actions it needs to take. In the third sequence shown in FIG. 4, the processing unit, having read the event registers, decides that further processing with an accurate clock frequency is required and generates a signal to enable the second oscillator circuit 8.

Thus, at T1, the PLL enable signal (ENABLE PLL) is also set in response to the processing unit and hence the second oscillator circuit 8 is enabled at time T1. The PLL is however not locked immediately but is locked a predetermined time 32 (T2–T1) after the second oscillator circuit 8 is enabled at time T1.

In the period between T2 and T1, the processing unit is still being clocked by the first clock signal (RINGO CLOCK) at the clock output 4 and therefore continues to perform task that do not require an accurate clock frequency.

At time T2, the PLL is locked and the lock signal (LOCKED) is set. Once the lock signal (LOCKED) has been set, the control circuitry 10 selects the second clock signal (PLL CLOCK) such that the second clock signal (PLL CLOCK) provides the system clock signal at the clock output 4. The enable logic 12, in response to receiving a set lock signal (LOCKED), negates the enable signal (ENABLE RINGO) and the ring oscillator circuit 20 is disabled.

Once the system clock signal switches to the second clock signal (PLL CLOCK), the processing unit is interrupted and can then enable functions that require an accurate clock frequency.

For the different embodiments and sequence of events described above, the switch from the first clock signal (RINGO CLOCK) to the second clock signal (PLL CLOCK) is spikeless.

During the low power mode the PLL and oscillator of the clock system in accordance with the present invention are disabled and hence the power consumption is kept to a minimum.

The first oscillator circuit has a very quick wake up time and thus very quickly generates a system clock signal after a wake-up event. This means that the processing unit can almost instantaneously process the wake-up event. Thus, the present invention takes advantage of the low power consumption of disabling both the PLL and oscillator in the low power mode whilst using the first oscillator circuit to provide almost immediate resumption of operation when an external wake-up event occurs.

In one of the embodiments described herein, the PLL and oscillator are enabled in response to a specific signal from the processing unit. This means that the PLL and oscillator are only enabled when they are required, for example when a more accurate clock signal is required. Therefore the present invention allows additional power savings by not requiring the PLL and oscillator to be enabled when it is not necessary.

In summary, the present invention provides a clock system that has a very quick wake up time due to the first oscillator circuit that allows the processing unit to immediately process the wake-up event, whilst the PLL and oscillator are being enabled, if at all, and minimum power consumption during the low power mode since the PLL and oscillator are both disabled during the low power mode.

In the above description the terms 'set' and 'negate' have been used to describe the transition of signals to a logic '1' state and a logic '0' state respectively. This is for illustrative purposes only and it is not intended to limit the invention to the specific arrangement described herein. For example, the first oscillator circuit 6 may be enabled in response to the enable signal (ENABLE RINGO) being set to a logic '0' state.

We claim:

1. A clock system for providing a system clock signal at a clock output, when enabled, for use by a processing unit, the clock system being enabled in response to a wake up signal provided by the processing unit, the clock system comprising:

first oscillator circuit being enabled in response to the wake up signal to provide a first clock signal at an output;

second oscillator circuit comprising a PLL and an oscillator, the second oscillator circuit when enabled providing a second clock signal and a lock signal at first and second outputs respectively when the PLL is locked;

control circuitry coupled to the output of the first oscillator circuit and to the first and second outputs of the second oscillator circuit for coupling the first clock signal to the clock output to provide the system clock signal or for coupling the second clock signal and not the first clock signal to the clock output to provide the system clock signal when the control circuitry receives the lock signal.

2. A clock system according to claim 1 wherein the second oscillator circuit is enabled in response to the wake up signal, and wherein the second oscillator circuit provides the lock signal a predetermined time after the second oscillator circuit is enabled.

3. A clock system according to claim 1 wherein the first oscillator circuit is disabled in response to a power down signal generated by the processing unit before the second oscillator circuit is enabled whereby the clock system is disabled and no system clock signal is generated.

4. A clock system according to claim 1 wherein the second oscillator circuit is enabled in response to a signal generated by the processing unit after the wake up signal, and wherein the second oscillator circuit provides the lock signal a predetermined time after the second oscillator circuit is enabled.

5. A clock system according to claim 1 wherein the first oscillator circuit is disabled in response to the second oscillator circuit generating the lock signal.

6. A clock system according to claim 1 wherein the first oscillator circuit comprises a ring oscillator circuit.

7. A clock system according to claim 6 wherein the ring oscillator circuit comprises an odd number of inverters connected in a ring in series with a resistor and capacitor, and a divider coupled to an output node in the ring to divide the signal at the output node by a multiple of two, the signal at an output of the divider forming the first clock signal, wherein oscillations of the ring oscillator circuit are enabled in response to the wake up signal.

* * * * *